US011777813B2

(12) United States Patent
Kolter et al.

(10) Patent No.: US 11,777,813 B2
(45) Date of Patent: Oct. 3, 2023

(54) SYSTEMS AND METHODS FOR EVENT ASSIGNMENT OF DYNAMICALLY CHANGING ISLANDS

(71) Applicant: C3.AI, INC., Redwood City, CA (US)

(72) Inventors: Jeremy Kolter, Redwood City, CA (US); Giuseppe Barbaro, Redwood City, CA (US); Mehdi Maasoumy Haghighi, Redwood City, CA (US); Henrik Ohlsson, Redwood City, CA (US); Umashankar Sandilya, Redwood City, CA (US)

(73) Assignee: C3.AI, Inc., Redwood City, CA (US)

( * ) Notice: Subject to any disclaimer, the term of this patent is extended or adjusted under 35 U.S.C. 154(b) by 0 days.

(21) Appl. No.: 17/736,631

(22) Filed: May 4, 2022

(65) Prior Publication Data
US 2022/0261695 A1    Aug. 18, 2022

Related U.S. Application Data

(63) Continuation of application No. 17/479,929, filed on Sep. 20, 2021, which is a continuation of application No. PCT/US2020/023738, filed on Mar. 19, 2020.
(Continued)

(51) Int. Cl.
*H04L 29/08*    (2006.01)
*H04L 41/16*    (2022.01)
(Continued)

(52) U.S. Cl.
CPC .......... *H04L 41/16* (2013.01); *G01R 19/2513* (2013.01); *G06N 7/01* (2023.01); *G06N 20/00* (2019.01); *H04L 67/12* (2013.01)

(58) Field of Classification Search
CPC ................................ H04L 41/16; G06N 20/10
See application file for complete search history.

(56) References Cited

U.S. PATENT DOCUMENTS

| 5,311,562 | A  |   | 5/1994  | Palusamy et al. |           |
|-----------|----|---|---------|-----------------|-----------|
| 8,611,323 | B2 | * | 12/2013 | Berger          | H04W 4/029 |
|           |    |   |         |                 | 455/404.1 |

(Continued)

FOREIGN PATENT DOCUMENTS

| AU | 2012344680 B2   | 10/2017 |
|----|-----------------|---------|
| WO | WO-2020197949 A1| 10/2020 |

OTHER PUBLICATIONS

European Patent Office, Communication, Extended European Search Report issued for European Patent Application No. 20778131.1, dated Jan. 31, 2023, 8 pages.
(Continued)

*Primary Examiner* — Adnan M Mirza
(74) *Attorney, Agent, or Firm* — Norton Rose Fulbright US LLP

(57) ABSTRACT

The present disclosure provides systems and methods that may advantageously apply machine learning to detect and ascribe network interruptions to specific components or nodes within the network. In an aspect, the present disclosure provides a computer-implemented method comprising: mapping a network comprising a plurality of islands that are capable of dynamically changing by splitting and/or merging of one or more islands, wherein the plurality of islands comprises a plurality of individual components; and detecting and localizing one or more local events at an individual component level as well as at an island level using a disaggregation model.

21 Claims, 6 Drawing Sheets

Related U.S. Application Data

(60) Provisional application No. 62/822,300, filed on Mar. 22, 2019.

(51) Int. Cl.
*H04L 67/12* (2022.01)
*G06N 20/00* (2019.01)
*G01R 19/25* (2006.01)
*G06N 7/01* (2023.01)

(56) References Cited

U.S. PATENT DOCUMENTS

| | | | |
|---|---|---|---|
| 9,628,501 B2 | 4/2017 | Datta Ray et al. | |
| 9,846,839 B2 | 12/2017 | Nasle et al. | |
| 2006/0259198 A1* | 11/2006 | Brcka | G05B 23/0254 700/246 |
| 2010/0145536 A1 | 6/2010 | Masters et al. | |
| 2014/0336960 A1 | 11/2014 | Haghighat-Kashani et al. | |
| 2018/0054063 A1 | 2/2018 | Parashar et al. | |
| 2022/0247644 A1 | 8/2022 | Kolter et al. | |

OTHER PUBLICATIONS

Kalles et al. Intelligent monitoring and maintenance of power plants (Apr. 2002). Retrieved Sep. 17, 2021 from: https://www.researchgate.net/publication/2945381_Intelligent_Monitoring_and_Maintenance_of_Power_Plants/link/563caaca08aec6f17dd7b3f6/download. 5 pages.

PCT/US2020/023738 International Preliminary Report on Patentability dated Sep. 28, 2021.

PCT/US2020/023738 International Search Report and Written Opinion dated Jun. 8, 2020.

U.S. Appl. No. 17/479,929 Office Action dated Sep. 27, 2022.

Xu et al. Island Partition of Distribution System with Distributed Generators Considering Protection of Vulnerable Nodes. Appl. Sci. Jul. 2017, 1057. 17 pages.

\* cited by examiner

| Time | Island of each component | | | | | Event |
|---|---|---|---|---|---|---|
| | 1 | 2 | 3 | 4 | 5 | |
| T=1 | A | A | B | C | C | A |
| T=2 | D | E | E | C | C | E |
| T=3 | A | A | F | F | F | F |
| T=4 | A | A | B | - | - | A |

| Time | Probability of event at component | | | | | Event |
|---|---|---|---|---|---|---|
| | 1 | 2 | 3 | 4 | 5 | |
| T=1 | 0.059 | 0.941 | 0 | 0 | 0 | A |
| T=2 | 0 | 0.830 | 0.170 | 0 | 0 | E |
| T=3 | 0 | 0 | 0.373 | 0.313 | 0.313 | F |
| T=4 | 0.059 | 0.941 | 0 | 0 | 0 | A |

SYSTEMS AND METHODS FOR EVENT ASSIGNMENT OF DYNAMICALLY CHANGING ISLANDS

CROSS-REFERENCE

This application is a continuation application of U.S. application Ser. No. 17/479,929, filed on Sep. 20, 2021, which is a continuation application of International Application No. PCT/US2020/023738, filed on Mar. 19, 2020, which application claims priority to U.S. Provisional Patent Application No. 62/822,300, filed on Mar. 22, 2019, each of which is incorporated herein by reference in its entirety.

BACKGROUND

Networks are commonplace systems of interconnected devices or components. The operation and control of networked systems can be quite complex under even ideal circumstances because network functions may require the performance of certain tasks synchronously, sequentially, or in more complex patterns. An example of a complex networked system is an electrical distribution network. Control and maintenance of an electrical grid is an especially complex problem given ever changing supply and demand levels. The current proliferation of renewable energy sources and large-scale battery systems poses a unique opportunity and challenge for the control of electrical distribution networks because they may offer greater resiliency to the networks, but they also tend to have intermittency in their power output. When unplanned events, such as the failure of a powerline, occur, electrical network control systems are challenged to properly respond and minimize the propagation of failures to other parts of the grid.

There is a need for predictive maintenance applications for networks such as electrical grids. Currently, most predictive maintenance applications can only assign an interruption event to a particular region of the grid rather than the specific component that caused the interruption. Certain interruption events, such as the severance of a region of the grid from the rest, can be predicted using relatively simple logic. However, as the complexity of a network increases, the logic of predictive maintenance becomes much more difficult. Thus, there is a need for improved predictive maintenance applications for complex networks that enhances the ability of the control system and system operators to respond to unexpected changes in the network configuration.

SUMMARY

A need exists for a predictive maintenance application for a networked system that is capable of handling the complex logic that describes interruption and reconnection events. Specifically, there is a need for network maintenance applications that can detect and ascribe network interruptions to specific components or nodes within the network. Moreover, there is a need for predictive maintenance applications that can learn from individual network interruption events and use the acquired data to predict and respond to future interruption events.

The present disclosure addresses at least the need for an enhanced predictive maintenance application of a networked system by utilizing a machine learning latent variable model. In some aspects, the present disclosure describes a disaggregation model that may be applied to the predictive maintenance of networked systems, such as electrical grids or telecommunication networks. A disaggregation model may offer increased refinement of the network description wherein interruption events can be traced to specific nodes or components rather than broader regions. The described latent variable model may be capable of handling more complex logic problems, such as the islanding of grid sections and the remerging of islands back in to the network. The predictive maintenance application may be able to assign interruption events to specific components using probabilistic modeling and use converged probability sets to predict the subsequent network behavior.

In some aspects, the present disclosure may describe a computer-implemented event assignment method comprising the mapping of a network comprising a plurality of islands that are capable of dynamically changing by splitting and/or merging one or more islands, such that the plurality of islands comprise a plurality of individual components and predicting and/or detecting and localizing one or more local events at an individual component level as well as at an island level may utilize a disaggregation model.

In some aspects, the present disclosure may describe a computer-implemented event assignment method that has a plurality of individual components comprising nodes and branches.

In some aspects, the present disclosure may describe a computer-implemented event assignment method within which the disaggregation model is configured to detect one or more local events at the individual component level, instead of at an island level.

In some aspects, the present disclosure may describe a computer-implemented event assignment method utilizing a disaggregation model that is configured to localize or isolate one or more local events at the individual component level.

In some aspects, the present disclosure may describe a computer-implemented event assignment method utilizing a disaggregation model that is configured to detect one or more local events at the individual component level as one or more of the islands are dynamically changing.

In some aspects, the present disclosure may describe a computer-implemented event assignment method within which the dynamic changing of islands comprises multiple instances of splitting, merging, and/or re-merging of one or more islands.

In some aspects, the present disclosure may describe a computer-implemented event assignment method within which the dynamic changing of the islands comprises joining and/or splitting two or more of the plurality of nodes and branches.

In some aspects, the present disclosure may describe a computer-implemented event assignment method within which the dynamic changing of the islands comprises splitting and/or merging of subsets of the individual components.

In some aspects, the present disclosure may describe a computer-implemented event assignment method within which the subsets of the individual components are of the same size.

In some aspects, the present disclosure may describe a computer-implemented event assignment method within which the subsets of the individual components are of variable sizes.

In some aspects, the present disclosure may describe a computer-implemented event assignment method utilizing a disaggregation model that is a machine learning latent variable model.

In some aspects, the present disclosure may describe a computer-implemented event assignment method utilizing a machine learning latent variable model that is implemented at the level of the individual components.

In some aspects, the present disclosure may describe a computer-implemented event assignment method within which the machine learning latent variable model comprises a plurality of latent variables corresponding to one or more local events at each of the individual components.

In some aspects, the present disclosure may describe a computer-implemented event assignment method within which one or more local events occurring at the individual component level are associated with one or more island events occurring at the island level.

In some aspects, the present disclosure may describe a computer-implemented event assignment method within which the machine learning latent variable model is configured to receive an observation of a selected island event occurring on a corresponding selected island, and process the observation based on an assumption that one of the plurality of latent variables had caused the selected island event to occur.

In some aspects, the present disclosure may describe a computer-implemented event assignment method within which a selected island event is caused by an individual component that is in or associated with the corresponding selected island.

In some aspects, the present disclosure may describe a computer-implemented event assignment method within which the machine learning latent variable model comprises a prior probability of each individual component causing each of one or more local events.

In some aspects, the present disclosure may describe a computer-implemented event assignment method within which the machine learning latent variable model is configured to perform exact posterior inference, based on prior probabilities, to assign one or more local events to the individual components.

In some aspects, the present disclosure may describe a computer-implemented event assignment method within which the assignment of the one or more local events to individual components comprises determining a probability estimate of each local event occurring at each of corresponding component.

In some aspects, the present disclosure may describe a computer-implemented event assignment method within which the machine learning latent variable model is configured to use probability estimates to update preceding or prior probabilities iteratively until convergence.

In some aspects, the present disclosure may describe a computer-implemented event assignment method within which the prior probability comprises an initially known, actual or estimated probability based on previous event data.

In some aspects, the present disclosure may describe a computer-implemented event assignment method within which preceding or prior probabilities are updated iteratively using an Expectation Maximization (EM) algorithm.

In some aspects, the present disclosure may describe a computer-implemented event assignment method that further comprises performing predictive maintenance at the individual component level based on one or more detected local events.

In some aspects, the present disclosure may describe a computer-implemented event assignment method within which the network comprises an electrical distribution network.

In some aspects, the present disclosure may describe a computer-implemented event assignment method within which the electrical distribution network comprises a plurality of distribution feeders.

In some aspects, the present disclosure may describe a computer-implemented event assignment method within which the plurality of nodes and branches are associated with the plurality of distribution feeders, and the connected nodes and branches within each feeder.

In some aspects, the plurality of individual components in the network are arranged in a geometric configuration selected from the group consisting of a one-dimensional configuration, a two-dimensional configuration, and an irregular configuration.

In some aspects, the plurality of individual components in the network are arranged in a two-dimensional configuration, and wherein the two-dimensional configuration is a rectangular configuration, a radial configuration, or a spoke-and-hub configuration.

In some aspects, the one or more local events comprise non-technical loss associated with one or more of the plurality of individual components.

In some aspects, mapping the network comprises identifying unexpected voltage levels in individual components of the network.

In some aspects, the present disclosure may describe a computer-implemented event assignment method within which one or more events comprise opening or closing one or more breaker switches within the electrical distribution network, and the one or more breaker switches are associated with one or more of the nodes and/or branches.

In some aspects, the present disclosure may describe a system for event assignment, comprising a server in communication with a network comprising a plurality of islands; and a memory storing instructions that, when executed by the server, causes the server to perform operations comprising mapping the network, such that the plurality of islands are capable of dynamically changing by splitting and/or merging one or more islands, and the plurality of islands comprise a plurality of individual components, and detecting and localizing one or more local events at an individual component level as well as at an island level using a disaggregation model.

In some aspects, the present disclosure may describe a non-transitory computer readable medium storing instructions that, when executed by one or more processors, causes one or more processors to perform an event assignment method comprising mapping a network comprising a plurality of islands that are capable of dynamically changing by splitting and/or merging of one or more islands, such that the plurality of islands comprises a plurality of individual components, and detecting and localizing one or more local events at an individual component level as well as at an island level using a disaggregation model.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

FIG. 5b is a chart of hypothetical probabilities of an event occurring at each node in FIG. 5a.

DETAILED DESCRIPTION

Figure 1:
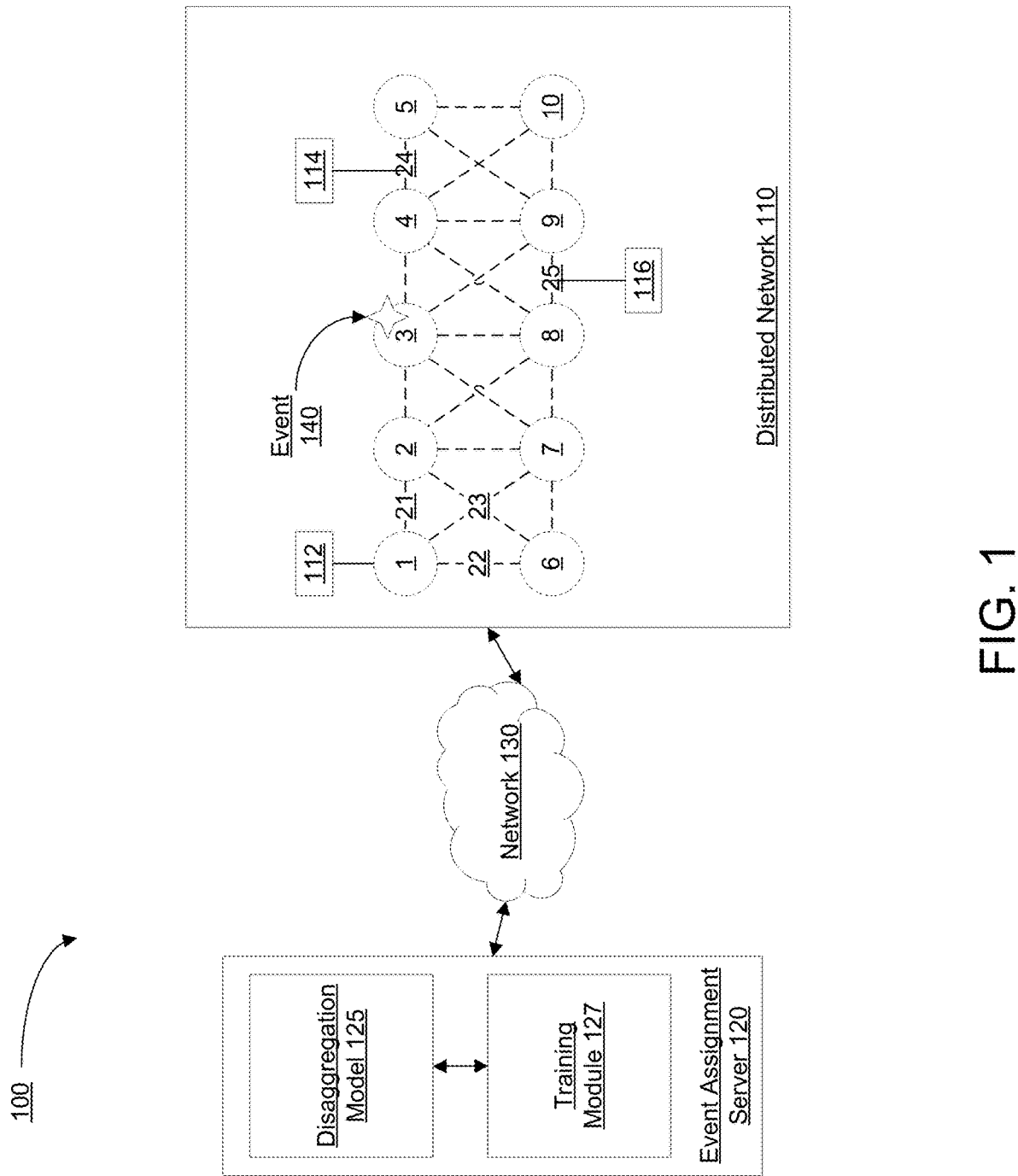
FIG. 1 is a diagram of an example predictive maintenance system.

The present disclosure describes system and methods for event assignment during the splitting and merging of networked systems. Networks, such as electrical grids, can be very complex, dynamic systems that require equally complex control systems to maintain proper function. Although the control of the system may be relatively straightforward during normal operation, when unexpected changes such as the removal of a component or the failure of a connection occur, the logic that controls a network may become more complex. The present disclosure provides systems and methods for improving the control of dynamically changing networks, which can be applied to the control of electrical grids, telecommunications networks, supply chain distribution networks, computer networks, social networks, oil and gas production networks, and the like.

Networks, such as electrical grids, can be made up of many components in numerous configurations. For example, in an electrical grid, the network may be composed of power plants, transmission lines, transformers, substations, and local energy sources such as rooftop solar panels. A network may be highly connected, such as an electrical grid in an urban area, or highly filamented and less interconnected, such as an electrical grid in a rural area. In general, more isolated components in networked systems are more vulnerable due to the lack of fallback connections if another connection fails. Conversely, highly connected networks may be prone to cascading effects if the components are intricately linked to one another, e.g. power surges associated with blackouts. A current challenge and opportunity in the control of networked systems is in developing methods to both understand the past behavior of the network and apply that understanding to predict the future behavior of the network.

In a complex network, such as an electrical grid, specific areas of the network with limited connectivity can become isolated if one or more connections fail. Such an event may be referred to as "islanding" due to the isolation of a subset of network components from the rest of the network. In a highly complex network, islands may frequently form and then remerge with the network as connections are restored. As an extended example, a windstorm may cause numerous grid failures due to downed power lines, leading to the formation of numerous isolated islands of blacked out customers. As power lines are restored, islands will remerge, shifting the way that power must be distributed. In some instances, the power line failures may be random, but in some instances the failures may be predictably tied to particularly vulnerable grid components. The ability to accurately predict likely failures, localize failures at the island/component level, and proactively anticipate the shifts in power demand as the grid is restored can help to enhance reliability and reduce the cost of grid operation.

The present disclosure describes the use of one or more machine learning algorithms to analyze the behavior of complex networks during islanding events and predict how the network will react as islands form and remerge with the network. The machine learning algorithms can be trained with data sets over time. As a machine learning algorithm becomes better-trained, it gains an improved ability to predict which specific component within an islanded system may have failed. Using the predictive results, control of the rest of the network can be adjusted accordingly to account for the eventual remerging of the islands based upon past performance. The present disclosure provides a faster and more efficient method relative to conventional network control systems for handling the control of complex networks.

FIG. 1 is a diagram of an example predictive maintenance system 100 that is configured to assign island-level events to particular components in a network and to predict future component-level events. The system 100 includes a network 110. The network 110 includes nodes, e.g., nodes 1 through 10, and branches that connect the nodes to each other, e.g., branches 21, 22, and 23 that connect node 1 to nodes 2, 6, and 7, respectively. For convenience, only some branches in the network 110 are identified. Moreover, the nodes and branches depicted in the network 110 are merely illustrative. In general, networks can have any useful combination, and any useful number, of nodes and branches. For example, networks can have any of the properties, characteristics, or features described in the following paragraphs:

A network as described herein may comprise a system of a plurality of interconnected components. In some aspects, a network may comprise at least 2 components, at least 3 components, at least 4 components, at least 5 components, at least 10 components, at least 25 components, at least 50 components, at least 100 components, at least 150 components, at least 200 components, at least 250 components, at least 500 components, at least 1000 components, at least 5000 components, at least 10000 components, at least 25000 components, at least 50000 components, at least 100000 components, at least 500000 components, at least 1000000 components, or more. In some aspects, each component may comprise a source, a device, a connector, a junction, a switch, or a sink. In some aspects, a component in a networked system may comprise a dynamic component such that it actively affects the behavior of the network, e.g. a power plant, or it may be a passive component that reacts to the behavior of the network, e.g. a light bulb. A network may comprise interconnected components of similar size or behavior, e.g. a computer network, or it may comprise interconnected components of highly variable size, e.g. household appliances.

A network as described herein may be connected directly or indirectly. In some aspects, a network may include a network connection comprising a corporeal linkage between components, e.g. powerlines in an electrical grid. In other aspects, a network may comprise a remote communication linkage between components, e.g. a wireless computer network. In some aspects, network connections may be constant, static, or permanent. In other aspects, network connections may be variable, changeable, or reconfigurable. In some aspects, a network connection may have physical or other properties that affect the behavior of the network. In some aspects, a network connection may comprise a network component, e.g. a powerline, transformer, or wireless router.

A network as referred to herein may also be described as a system of a plurality of interconnected nodes. In some aspects, a network may comprise at least 2 nodes, at least 3 nodes, at least 4 nodes, at least 5 nodes, at least 10 nodes, at least 25 nodes, at least 50 nodes, at least 100 nodes, at least 150 nodes, at least 200 nodes, at least 250 nodes, at least 500 nodes, at least 1000 nodes, at least 5000 nodes, at least 10000 nodes, at least 25000 nodes, at least 50000 nodes, at least 100000 nodes, at least 500000 nodes, at least 1000000 nodes, or more. A node may comprise one or more components. In some aspects, a node may be a single device, connector, junction, switch, or sink. In some aspects, a node may comprise multiple components that are grouped together, e.g. a house comprising numerous appliances and other electrical sinks. In some aspects, a node in a network may have one or more connections to other nodes. In some aspects, a node may have no connections to other nodes.

A network as described herein may be arranged in numerous geometric configurations. In some aspects, a network may comprise a one-dimensional connection of nodes, for example a node may be classified as a terminal, a terminal node may only have a connection to one other node, a central node that may have two connections to other nodes, or an isolated node that has no connections to other nodes. In some aspects, a connection between two nodes may be severed, a central node may become a terminal node, or a terminal node may become an isolated node.

In some aspects, a network may comprise a two-dimensional network. In some aspects, a node in a two-dimensional network may comprise one or more connections to other nodes. In other aspects, an isolated node in a two-dimensional network may have no connections to other nodes. In some aspects, a connection in a two-dimensional network may comprise a bottleneck if there are no other connections that allow a pathway between the two nodes at the ends of the chosen connection.

In some aspects, a network may comprise a two-dimensional grid that can be spatially represented in a rectangular fashion. In some aspects, a rectangular grid may comprise nodes that only have operative connections to their nearest neighbors. In some aspects, a network may comprise a two-dimensional grid that can be spatially represented in a radial fashion. In some aspects, a radial grid may comprise a plurality of linear series of nodes radiating outward from one or more central nodes. In some aspects, a network may comprise a spoke-and-hub geometry wherein connections radiate outward from a central node to satellite nodes. In some aspects, the satellite nodes of a spoke-and-hub network may have operative connections. In some aspects, a spoke and hub model may comprise several nested layers of satellite nodes, whereby concentrically-connected satellite rings may form around a hub node.

In some aspects, a network may comprise a hybrid geometry of linearly-interconnected, rectangularly-interconnected, or radially-interconnected nodes. In some aspects, a network may comprise an irregular geometry with connectivities in complex or asymmetric patterns. In some aspects, a network may comprise a network of more than two dimensions, whereby additional dimensions may comprise different characteristics or physical properties that distinguish aspects of the network, e.g. a single-phase electrical grid in connectivity with a multi-phase electrical grid.

A network as described herein may comprise numerous types of dynamic systems. The methods of the present disclosure may be applied to any system that meets the basic description of a network such as those described above. Subsequently described systems are exemplary to help describe the types of systems for which an event assignment algorithm may be beneficial.

A network may be defined by its physical connectivity. In some aspects a network may comprise an electrical grid system, whereby electricity may be distributed from various generating sources to various sinks.

A network as described herein may be defined by its data connectivity. In some aspects, a network may comprise a computer network. A computer network may comprise components such as processors, hard drives, ethernet cards, ethernet cables, wireless receivers, or wireless routers. In some aspects, a computer network may comprise a mainframe computer or a server system.

A network as described herein may be defined by spatial connectivity. In some aspects, a network may comprise an air traffic control system, whereby individual planes are operatively associated with a particular control station, and switch associations when they enter the control region of a different station.

A network as described herein may be defined by multiple modes of connectivity. In some aspects, a network may comprise a system of manufacture. A system of manufacture may comprise electrical components, computer components, conveyance devices, material feeding systems, parts handling systems, robotic devices, or other interconnected devices.

A network as described herein may comprise one or more computers for control of the network. In some aspects, a computer control system may automatically control the function one or more components of the network. In some aspects, a computer control system may require user input as part of its decision-making process. In some aspects, a computer control system may comprise a reactive system that redistributes and balances network tasks or behaviors as changes occur. In some aspects, a computer control system may comprise a predictive system that anticipates and preemptively redistributes and balances tasks or behaviors before changes occur. In some aspects, a predictive control system may comprise a machine learning algorithm.

A network as described herein may experience events that alter the behavior or characteristics of the network. An event may comprise an alteration, deletion, upgrade, failure or other change to one or more components or nodes within the network. In some aspects, an event may comprise a failure within the network. A failure may comprise a severed link, hardware failure, disruption of data transfer, or any other event that inhibits the performance of the network. An event may comprise an upgrade to the system such as the addition of a new component or node, or the transient fluctuations in output from a component or node with variable operation. In some aspects, an event may create a bottleneck when flow between two components or nodes becomes constrained by a lack of connections. In some aspects, the severing of a bottleneck in a network may comprise islanding. Islands may remerge with the main network by the reestablishment of connections between the two entities.

Returning to FIG. 1, the network 110 also includes sensors 112, 114, and 116. The sensor 112 collects data at node 1, and the sensors 114 and 116 collect data at branches 24 and 25, respectively. The sensors 112-116 can collect different data depending on the type of network the network 110 is. For example, if the network 110 is an electrical distribution system, the sensors 112-116 can be voltage sensors that collect voltage data. If the network 110 is instead a supply chain network, the sensors 112-116 may be vehicle sensors or traffic sensors, for example. The sensors 112-116 can communicate with an event assignment server 120 over a wired or wireless network 130.

The system 100 also includes an event assignment server 120 that implements a disaggregation model 125. The event assignment server 120 can be located at or near any node or branch of the network 110, or it can be remotely located. Although referred to as a singular server in this disclosure, the event assignment server 120 can actually be multiple servers in multiple locations.

The disaggregation model 125 can be implemented on the event assignment server 120 in software, hardware, or a combination of the two. The disaggregation model 125 is configured to, i.e., trained to, use the data from the sensors 112-116 to detect, isolate, and localize island-level events that occur in the network 110. That is, the disaggregation model 125 is configured to determine the nodes or branches in the network 110 that are responsible for, or that are the source of, events. For example, using data collected by the sensors 112-116, the trained disaggregation model 125 can determine that the source of an event 140 is node 3 of the network 110. The disaggregation model 125 can additionally or alternatively use data from external sources (e.g., weather data) to determine the source of an event. Events will be described in more detail later.

Without the disaggregation model 125, the event assignment server 120 would not be able to localize events to particular nodes or branches in the network 110. This is because sensor data is not available at every node and branch. The disaggregation model 125 will be described in greater detail in reference to FIG. 3 and FIG. 4.

The event assignment server 125 also includes a training module 127 that aids in training the disaggregation model 125. The training module 127 can be a computer program that implements a training process for the disaggregation model 125. Training of the disaggregation model 125 will be described in more detail in reference to FIG. 4.

Figure 2:
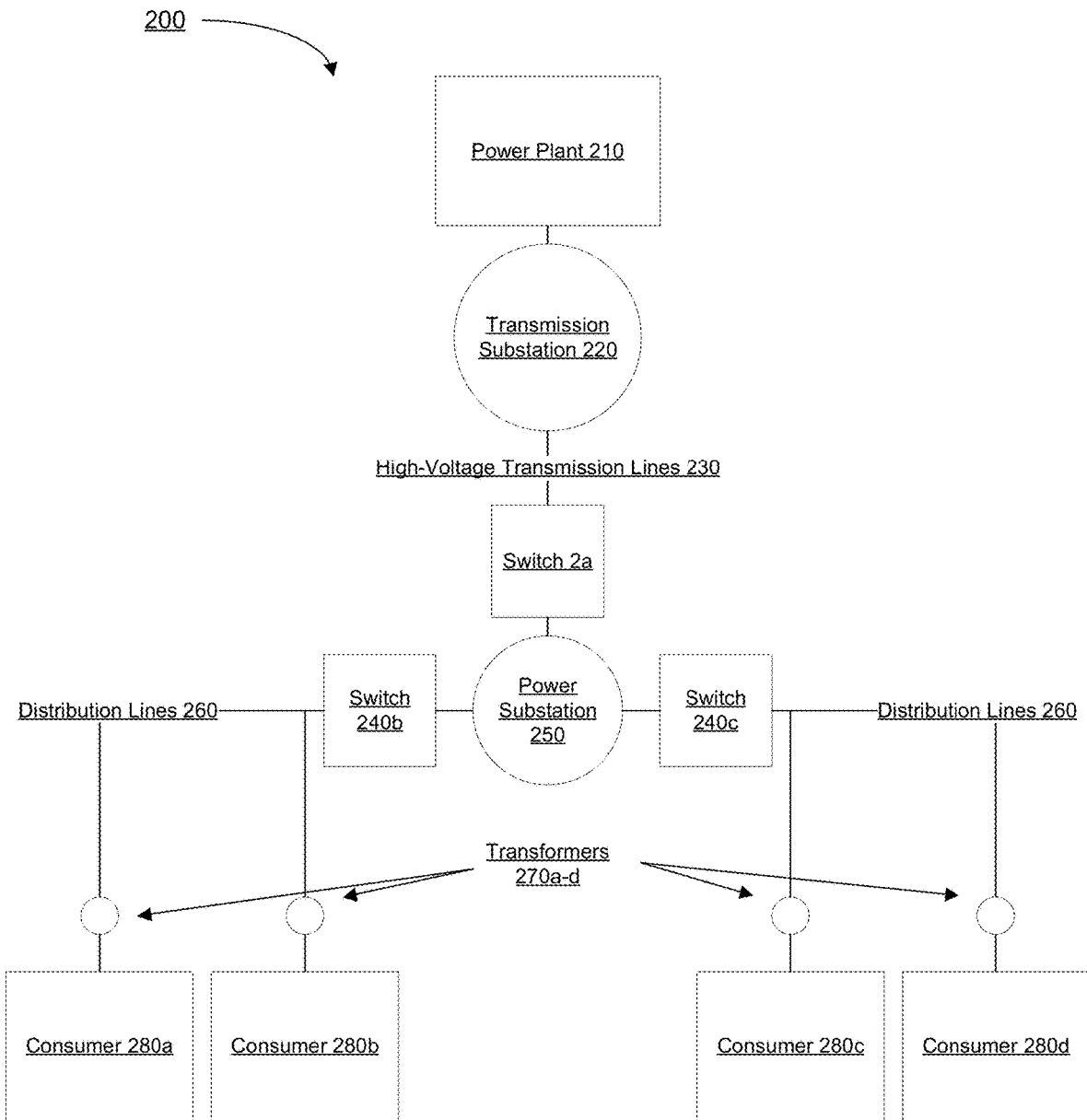
FIG. 2 is a diagram of an example electrical distribution network.

FIG. 2 is a diagram of an example electrical distribution network 200. The electrical distribution network 200 includes a power plant 210, a transmission substation 220, high-voltage transmission lines 230, switches 240*a-c*, a power substation 250, distribution lines 260, transformers 270*a-d*, and consumers 280*a-d*. The power plant 210 can generate electricity. The transmission substation 220 can transform the electricity generated by the power plant 210 to high-voltage electricity. The high-voltage transmission lines 230 can transmit the high-voltage electricity over long distances. The switches 240*a-c* can isolate parts of the electrical distribution network. The power substation 250 can transform the high-voltage electricity from the high-voltage power lines 230 into electricity that distribution lines 260 can safely carry. And the transformers 270*a-d* can transform electricity from the distribution lines into electricity that has the appropriate voltage for consumers. Although not depicted, the electrical distribution network can include distribution feeders. Distribution feeders are the connections between the output terminals of the power substation 250 and the input terminals of the distribution lines 260. The nodes and branches in the networks described herein can be associated with the distribution feeders, and the connected nodes and branches within each distribution feeder. Any of the components described above can be outfitted or integrated with sensors that collect data about the components. Such data can be used by the algorithms described herein. Electrical distribution networks are described in greater detail in the following paragraphs:

An electrical distribution network as described herein may comprise any system that conveys electrical energy from sources to sinks. An electrical distribution network may comprise a grid system. In some aspects, an electrical distribution network may comprise an interconnected system of electrically-connected components whereby electricity flow is used to drive or actuate a plurality of components, e.g. a factory assembly line. An electrical distribution network may comprise an interconnected system of power sources, transmission lines, junctions, switches, and power sinks. An electrical distribution network may comprise one or more computers for purposes such as control, monitoring, maintenance, optimization, or any other necessary network function.

An electrical distribution network as described herein may comprise one or more power sources. A power source may comprise any device, component, source, or installation that feeds electrical energy into the distribution network. A power source may comprise a large generation facility such as a combustion-driven power plant, a gasifier plant, a nuclear power plant, a hydroelectric power plant, a geothermal power plant, a solar thermal power plant, a photovoltaic plant, a wind farm, or a tidal generator complex. Large-scale power sources may be base-loading, peak-loading, or load-following sources. Large-scale combustion and gasifier systems may utilize a variety of fuels, including coal, petroleum, biomass, oil shale, and municipal solid waste. A power source may comprise a small-scale generation source such as a rooftop photovoltaic panel, a micro-turbine, a gas generator, a diesel generator or a windmill. A power source may comprise an electrochemical device such as a hydrogen fuel cell, a solid-state fuel cell, or a battery. A battery system may comprise an alkaline battery, an aluminum-air battery, a lithium metal battery, a molten salt battery, a nickel oxohydride battery, a solid-state battery, an aluminum-ion battery, a lead acid battery, a nickel metal hydride battery, a lithium cobalt battery, a lithium manganese battery, a lithium ion polymer battery, a lithium phosphate battery, a lithium sulfur battery, a magnesium-ion battery, and a nickel-cadmium battery.

Power sources may feed electricity in a variety of fashions. A power source may comprise a direct current source. A power device may comprise an alternating current source. In some aspects, an alternating current source may comprise a single-phase or three-phase source. A power source may comprise a particular voltage. A direct current power source may comprise 72V or more, 48V or more, 36V or more, 24V or more, 18V or more, 12V or more, 5V or more, 1.5V or more, 1V or more, 0.1V or more, or 0.01V or more. Alternatively, a direct current power source may comprise at most 72V, at most 48V, at most 36V, at most 24V, at most 18V, at most 12V, at most 5V, at most 1.5V, at most 1V, at most 0.1V, or at most 0.01V. An alternating current power source may comprise a particular voltage. An alternating current power source may comprise 765 kV or more, 500 kV or more, 230 kV or more, 115 kV or more, 69 kV or more, 240V or more, 230V or more, 220V or more, 120V or more, 110V or more, 10V or more, 1V or more, or 0.01V or more. In other cases, an alternating current power source may comprise at most 765 kV, at most 500 kV, at most 230 kV, at most 115 kV, at most 69 kV, at most 240V, at most 230V, at most 220V, at most 120V, at most 110V, at most 10V, at most 1V or at most 0.01V. In some aspects, an alternating current power source may operate at 50 hertz or 60 hertz.

An electrical distribution network as described herein may comprise a plurality of transmission elements that operatively connect components or nodes within the network. A transmission element may comprise a component or node having properties that may affect the behavior of the network. A transmission element may comprise any object or device capable of transmitting electrical charge. A transmission element may comprise a wire, cable, conduit or cord. A transmission element may comprise a bundle or collection of a plurality of individual wires or cables. A transmission element may comprise a metal conductor, a superconductor, or a semiconductor. In some aspects, a transmission element may comprise a powerline. In some aspects, a powerline may comprise a high-tension powerline. In other aspects, a transmission element may comprise a subtransmission powerline, a feeder line, or a distribution line. In some aspects, a transmission element may be above ground. In other aspects, a transmission element maybe buried or submerged. In some aspects, a transmission element may be permanently affixed. In other aspects, a transmission element may be detachable or separable.

An electrical distribution network as described herein may comprise a plurality of junctions or switches. A junction may comprise a point of connection between two or more transmission elements. A junction may comprise one transmission element splitting into two or more transmission elements. A junction may comprise two or more transmission elements merging to result in a fewer number of transmission elements. In some aspects, a junction may comprise a transformer. In some aspects, a junction may comprise an electrical substation. In some aspects, a junction may comprise a terminal or connecting plate. An electrical distribution network may comprise a plurality of switches or breaks. A switch may comprise any element that can interrupt an electrical flow or switch an electrical flow from on transmission element to a different transmission element. A switch may comprise a manually- or mechanically-controlled device. A switch may be electronically-controlled. A switch may be controlled by the actions of a computer. A switch may comprise a relay such as a mechanical relay or a solid-state relay. An electrical distribution system may comprise a plurality of breaks. A break may comprise any device or component that temporarily or permanently disrupts electrical flow. A break may comprise a fuse or an open switch. A break may be a passive or active element in the electrical distribution system.

Electrical energy may be consumed or dissipated at various sinks. An electrical sink may comprise any device that converts electrical energy into mechanical, thermal, or electromagnetic energy. An electrical sink may comprise common devices, including, but not limited to computers, lights, washers, dryers, refrigerators, pumps, compressors, microwave ovens, electric furnaces, stoves, fans, winches, motors, tools, and electric dissipation water heaters. In some aspects, a battery system may behave as a source during discharge and a sink during charging. In some aspects, a sink may comprise a grounding or neutral connection.

An electrical distribution network as described herein may comprise other components. Electrical components may be passive or active. An electrical component may comprise a resistor, diode, rectifier, transistor, light-emitting diode, amplifier, inductor, fuse, potentiometers, capacitor, or solenoid.

An electrical distribution network as described herein may comprise one or more computers for control of the network. In some aspects, a computer control system may automatically control the function of the electrical distribution network. In some aspects, a computer control system may require user input as part of its decision-making process. In some aspects, a computer control system may comprise a reactive system that redistributes and balances electrical loading as changes occur. In some aspects, a computer control system may comprise a predictive system that anticipates and preemptively redistributes and balances electrical loading before changes occur. In some aspects, a predictive control system may comprise a machine learning algorithm.

An electrical distribution network as described herein may comprise a conventional power grid system. An electrical grid may comprise an interconnection of power sources, transmission devices and power sinks in a local area, a region, a nation or in an international grid. A grid may comprise one or more large-scale power sources that provide continuous base-loading. In some aspects, a grid may comprise a network of small-scale devices, e.g. photovoltaic cells, that feed electrical energy to the grid in regular or irregular patterns. A grid may comprise a synchronous grid whereby the alternating current occurs with the same phase and frequency throughout the entire grid. An electrical grid may comprise more than one voltage with changes mediated by devices such as transformers.

An electrical distribution network as described herein may comprise a micro-grid. A micro-grid may comprise a small-scale or isolated grid. A micro-grid may comprise conventional energy sources such as a gas generator. A micro-grid may comprise renewable energy sources, such as a wind turbine. In some aspects, a micro-grid may operate independently of a conventional power grid. In other aspects, a micro-grid may be connected to a large-scale grid. A micro-grid may comprise on or more computers that control the function of the micro-grid. In an event wherein one or more connections between a micro-grid and a conventional grid are severed, a micro-grid may be capable of self-sustaining operation without supply or control from the main grid system.

An electrical grid as described herein may be arranged in several geometries. An electrical distribution network may comprise a radial network. A radial network may comprise a tree network whereby individual radial branches subdivide into smaller branches which may, in turn, subdivide into yet smaller branches. An electrical distribution network may comprise a mesh network. A mesh network may comprise a loop system or a tied ring system. An electrical distribution network may comprise a more complex geometry that hybridizes aspects of radial and mesh networks.

An electrical distribution network as described herein may experience events that alter the distribution and flow of electrical energy. An event may comprise an alteration, deletion, upgrade, failure or other change to one or more components or nodes within the electrical network. In some aspects, an event may comprise a failure within the network. A failure may comprise a severed transmission line, a black out, a power station emergency, or a cascading failure. An event may comprise an upgrade to the system such as the addition of a new power source or the transient fluctuations in power output from a power source such as a wind turbine or a photovoltaic cell. In some aspects, an event may create a bottleneck when flow between two components or nodes becomes constrained by a lack of connections. In some aspects, the severing of a bottleneck in an electrical distribution network may comprise islanding. Electrical islands may remerge with the main power grid by the reestablishment of connections between the two regions.

An event in an electrical distribution network may comprise a loss event. A loss event may comprise an anticipated or unanticipated drop in electrical load in one or more regions of an electrical grid. A loss event may comprise a technical loss. A technical loss may comprise a constant source of loss, such as the resistive losses in a transmission line or transformer losses. In some aspects, an electrical grid control system may account for technical losses in its algorithms. A loss event may comprise a non-technical loss (NTL). An NTL may comprise any unanticipated source of loss. In some aspects, an NTL may comprise theft of electrical service, tampering with electrical meters, meter malfunctions, control system errors, or acts of sabotage to electrical equipment. In some aspects, NTLs may be not accounted for or poorly accounted for in electrical grid control systems. In other aspects, NTLs may be accounted for by grid control systems applying machine learning algorithms to detect unanticipated losses.

In some cases, the components described herein may include a power sensing meter. The power sensing meter may be attached to an electrical mains unit in a building. In some instances, a power sensing meter may be located at an electricity substation, on a utility pole serving the building, or in a meter box adjacent or in the building. The building may be a residential building or a commercial building. The building may be a home, or any type of structure that may produce and/or consume electricity.

A power sensing meter as described herein may comprise an electricity smart meter and/or a solar energy monitor. The distribution network described herein may comprise a power monitoring module.

A smart meter may comprise one or more sensors configured to measure and record electricity consumption of a building in real-time or near real-time. Appliances and fixtures in the building may consume electricity, and their electricity consumption may be measured and recorded by the smart meter. For example, the smart meter may be configured to record electric energy consumption in time intervals, and to provide the data at a predetermined frequency to the power monitoring module. The predetermined frequency may range from every minute, 5 minutes, 10 minutes, 15 minutes, 30 minutes, 1 hour, 12 hours, or 24 hours. Any range of frequency may be contemplated. In some instances, the predetermined frequency may range from less than every 1 hour, 30 minutes, 1 minute, 45 seconds, 30 seconds, or 15 seconds. Accordingly, the electricity consumption data may comprise a measure of the electricity consumption as a function of time. For example, the measured electricity consumption may be time stamped. In some instances, the electricity consumption data may be recorded and stored for at a remote database or server.

In some instances, the smart meter may be configured to collect electricity consumption data for remote reporting to a utility provider, for monitoring and/or billing by the utility provider. The smart meter may also be configured to send power outage notifications to the utility provider, and to monitor the quality of power delivered to the building (for example, power transmission rate, power continuity, voltage peaks, etc.). The smart meter may be connected to the electricity grid, and may be used to determine a power load of the building on the grid.

Any description of a smart meter may also apply to any type of device used to measure electricity consumption. For instance, this may include a built-in electricity meter at a building that sends electricity consumption data to a utility. Any description of a smart meter may apply to a meter which includes "smart" functionality such as two-way real-time or near real-time signal communications between the meter and the utility.

A solar energy monitor as described herein may comprise one or more sensors configured to measure and record solar-based electricity generation in real-time, near real-time, or at intermittent periods. The electricity may be generated using a solar power system located at the building. The solar power system may comprise one or more solar panels configured to convert sunlight into electricity. In some embodiments, the solar power system may be a photovoltaic system (also known as a solar PV power system or a PV system). The PV system is a power system designed to supply usable solar power by means of photovoltaics. The PV system may comprise an arrangement of several parts, including solar panels to absorb and convert sunlight into electricity, a solar inverter to change the electric current from DC to AC, as well as mounting, cabling and other electrical accessories to set up a working system. PV systems may be generally categorized into three distinct market segments: residential roof-top, commercial roof-top and ground-mount utility-scale systems. Their capacities may range from a few kilowatts to hundreds of megawatts. A typical residential system may be around 10 kilowatts and mounted on a sloped roof, while commercial systems may reach a megawatt-scale and are generally installed on low-slope or even flat roofs.

The solar energy monitor described herein may be configured to record electric energy generation in time intervals, and to provide the data at a predetermined frequency to the power monitoring module. The predetermined frequency may range from every minute, 5 minutes, 10 minutes, 15 minutes, 30 minutes, 1 hour, 12 hours, or 24 hours. Any range of frequency may be contemplated. In some instances, the predetermined frequency may range from less than every 1 hour, 30 minutes, 1 minute, 45 seconds, 30 seconds, or 15 seconds. Accordingly, the electricity generation data may comprise a measure of the electricity generation as a function of time.

In some instances, the solar energy monitor may be configured to collect solar power production data. The solar energy monitor may include any device or system that is capable of monitoring solar production data. The solar power production data may be obtained through one or more inverters at the solar power system located at the building. An inverter can convert the variable direct current (DC) output of a photovoltaic (PV) solar panel in the solar power system into a utility frequency alternating current (AC) to power ordinary AC-powered equipment. The measure of the converted current may be indicative of the solar power production data. The solar power production data may be sent to a solar monitoring system. The solar monitoring system may be configured to store, update, and monitor the solar production data.

The predictive maintenance system described herein can be used to predict component-level events in networks other than electrical distribution networks. For example, the predictive maintenance system can be used to predict events in telecommunications networks, supply chain networks, computer networks, oil and gas production networks, or social networks.

A telecommunications network as described herein may comprise a plurality of devices for transmitting data within the network. Telecommunications networks may include telephonic networks, computer networks, financial transaction networks, satellite networks, and any other interlinked network based upon data transmission. Telecommunications networks may comprise a plurality of data transfer and data acquisition devices in direct or indirect operative communication with each other. Telecommunications networks may also comprise devices for data processing and control. In some aspects, a telecommunications network may comprise an interlinked series of components capable of sending and receiving data, for example an aircraft communications addressing and reporting system (ACARS) system for communication between aircraft and ground control stations. In some aspects, a telecommunications network may comprise an interlinked series of devices that solely transmit data to a central acquisition hub, for example networks for remote weather sensing.

A component or node in a telecommunications network may comprise a data transfer or acquisition device. A component or node in a telecommunications network may be associated with an address that identifies the location of the device within the network. In some aspects, a data transfer or acquisition device may be associated with a fixed address. In other aspects, a data transfer or acquisition device may have a variable address that reconfigures at a random or regular interval. A component or node may comprise a data transmitting device, such as a sensor or a radio transmitter. A component or node may comprise a data receiving device, such as a pager, a television, a radio, a printer, or an answering machine. A component or node may comprise a device capable of sending and receiving data, such as a fax machine, a switchboard, an ethernet hub, a wireless router, a computer, a landline telephone, a wireless telephone, a communications satellite, or a modem.

A telecommunications network may achieve operative connectivity for data transmission via electrical or electromagnetic signaling. In some aspects, connectivity in a telecommunications network may be achieved via hardwired connections such as ethernet cables, coaxial cables, fiber optic cables, or phone lines. In some aspects, connectivity in a telecommunications network may utilize electromagnetic transmission equipment for data transfer, such as transmitters, receivers, satellite dishes, waveguides, antennae, and repeaters. In some aspects, data transmission may occur via the transmission of packets. In other aspects, data may be transmitted in a streaming or continuous fashion. In some aspects, data transmission may be governed by a communications protocol, such as TCP/IP, IPX/SPX, X.25, or AX.25.

A telecommunications network may experience events that create a topological rearrangement of components or nodes and connections within the network. In some aspects, an event may comprise the addition or removal of a device from the network. In other aspects, an event may comprise the alteration or reassignment of the address of a component of the network. In some aspects, an event may comprise a physical or non-physical failure within the network. A physical failure may include the disruption of a transmission line or an outage due to the electromagnetic effects of a solar storm. A non-physical failure may include false or failed transmissions. An event in a telecommunications network may be temporary, such as an outage, or permanent, such as the removal of a device from the network.

A telecommunications network can be a mesh network. A mesh network is a network in which the nodes of the network connect directly, dynamically, and non-hierarchically to other nodes in the network. The non-hierarchical arrangement of the nodes prevents the failure of one node from affecting large portions of the network and allows nodes to cooperate with one another to efficiently route data to or from clients. Mesh networks can be "self-healing" mesh networks in that they can automatically reconfigure when a particular node fails, e.g., when an event occurs at that node, to avoid transmitting data through that node. Data about how a self-healing mesh network automatically reconfigured itself can be used to localize events.

Some telecommunications networks may comprise computer networks. A computer network may comprise a plurality of computer devices as well as devices under the control of one more computers. A computer network may be a closed system or an open system. An open computer network may comprise one or more connections to other computer networks. A computer network system may include personal area networks, local area networks, wireless local area networks, wide area networks, system-area networks, enterprise private networks, and virtual private networks.

A computer network may comprise a plurality of components or nodes comprising interlinked devices. A computer network may include components such as desktop computers, laptop computers, handheld or tablet computers, wireless phone devices, modems, routers, hubs, servers, printers, monitors, touchscreens, and scanners. A computer network may also comprise hardware components such as robotics or programmable logic controller (PLC) controllers that perform tasks under the control of the network. A component of a computer network may be involved in a variety of tasks including data transfer, data acquisition, control, signaling, computation, processing, and display. A component in a computer network such as aa display screen may serve a passive role. A component in a computer system such as a process controller may serve an active role.

A computer network may have operative connectivity via hardwiring or wireless connections. Hardwiring may include ethernet cables, USB cables, flash drives, pin connectors and any other form of connection that permits the transfer of data between components of a computer network. A computer network may be connected by a wireless network. Wireless connectivity may include hubs, routers, and any other devices necessary for the transmission of electromagnetic signaling between computer devices.

A computer network may experience events that create a topological rearrangement of components or nodes and connections within the network. In some aspects, an event may comprise the addition or removal of a computer device from the network. In other aspects, an event may comprise the alteration or reassignment of the address of a component within the network. In some aspects, an event may comprise a physical or non-physical failure within the network. A physical failure may include any event related to hardware disruption or severance, such as the jamming of printer. A non-physical failure may include any event related to failure in data transmission, acquisition, processing, or output. A non-physical failure may include a failure to transmit data, such as an outage in a server or router. A non-physical failure may also include events related to malicious activities, such as the removal of a networked computer by ransomware, the forced quarantine of a computer device that is infected with malicious code, or the overloading of one or more components by high-volume data transmission during a distributed denial of service attack. An event in a telecommunications network may be temporary, such as an outage, or permanent, such as the removal of a device from the network.

A social network as described herein may comprise a plurality of users connected via a relational framework. A social network may build a relational framework based on numerous factors such as geography, occupation, nationality, political preference, familial relations, friendships, or any other factor that distinguishes amongst the components of the network. A social network may have a classification system that includes various levels of taxonomy including institutions, families, individuals, or combinations thereof.

In some aspects, a component of a social network may comprise an individual user of the social network. In other aspects, a component of a social network may comprise a collection of individual users grouped together within a unifying classification such as a common employer, alumni status, family, hobby, or any other grounds for classification. In some aspects, an individual user within a social network may be connected to other users via multiple forms of classification.

Connectivity in a social network may be self-defined or system-defined. In some aspects, a user of a social network platform may choose how they are classified and may establish connectivity to other users within the network accordingly. In other aspects, a computer algorithm may form connections between individual users or components based upon acquired data or user-supplied data. Connectivity between components in a social network may be permanent or severable, either by users or by a governing computer algorithm.

Events in a social network may include any changes to the connectivity within the network. For individual users, events may be tied to life events such as births, marriages, deaths, divorce, matriculation, graduation, employments, promotion, firing or layoffs, illness, or any other personal event that alters the relations between individual users within the social network. At an institutional level, connectivity may be altered by events such as mergers, acquisitions, divisions or subsidiary relationships, turnover, change of leadership, realignments, or throughput, e.g. class changes at schools. Event occurrence in a social network may be highly random, such as the formation of new friendships, or very predictable, such as work availability of scheduled employees.

An oil and gas production network as described herein may include drilling assets, refining assets, and pipeline assets. Drilling assets may include platforms, drilling rigs, drill bits, casing, pumps, and the like. Drilling assets may be on-shore or off-shore assets. Refining assets may include any machines or equipment typically found in a refinery plant, including distillation units (e.g., crude distillation units and vacuum distillation units), catalytic reformers, hydrocrackers, treaters (e.g., amine treaters, merox treaters, hydrotreaters, and the like), and the like. Pipeline assets may include pipelines, pumps, compressors, heat exchangers, valves, and the like.

The nodes in an oil and gas production network may be the drilling and refining assets. The nodes may be connected by the pipeline assets and other supply chain infrastructure, e.g., roads, railways, shipping lanes, and the vehicles that use such roads, railways, and shipping lanes. Events in an oil and gas production network may be mechanical or electrical failures. For example, the events may be failures of drilling, refining, or pipelines assets. Additionally or alternatively, events may be weather events, e.g., weather that prevents drilling or cause breaks in the supply chain. Additionally or alternatively.

The drilling, refining, and pipeline assets may be outfitted with sensors that collect data about such assets. The sensors can be thermometers, pressure gauges, flow meters, accelerometers, magnetometers, and the like. The data collected by such sensors can be used by the algorithms described herein to predict and localize events in the oil and gas production network.

A supply chain network as described herein includes a plurality of physical locations, routes between the physical locations, vehicles that navigate the routes, and personnel that work in the physical locations and operate the vehicles. Supply chain networks often rely on coordination between multiple entities, e.g., business organizations, operating in many countries over thousands or millions of square miles. Supply chain networks are configured to efficiently transport goods from one or more sources to a plurality of destinations.

The nodes in a supply chain network can include: supplier manufacturing plants, assembly plants, regional distribution centers, local distribution centers, and destinations, e.g., residential or commercial customers. The branches in a supply chain network can include roads, railways, shipping lanes, and flight paths that connect the nodes in the supply chain network together.

Supply chain networks also include the vehicles that carry goods on the routes of the supply chain network, and the people that operate the vehicles and work at the plants and distribution centers. The vehicles in a supply chain network can include trucks, trains, ships, planes, and the like. Generally, one or more people operate each vehicle. The manufacturing plants and distribution centers also generally employ a number of people to facilitate manufacturing processes, organization of goods, and loading of goods into vehicles.

Operators of supply chain networks can collect data about the supply chain networks from a variety of sources. For example, they can collect weather data from Doppler radar sensors or publically available sources; traffic data from vehicles in the supply chain network or from publically available sources like Google Maps or Waze; vehicle data, e.g., mileage or maintenance records of vehicles in the chain network; and manufacturing equipment data. Because supply chain networks can span hundreds or thousands of miles and multiple countries, it is generally not feasible to collect data about every node, branch, and vehicle in the supply chain networks.

Events, i.e., failures, in supply chain networks can disrupt supply chain networks, causing costly shipping delays. For commercial customers, for example, disruptions in the supply chain network can cause decreased production, e.g., because component parts of products are not available. For this reason, predicting and preventing events before they occur can be beneficial.

Events in a supply chain network can include weather events or similar natural disasters, e.g., hurricanes, snow storms, floods, forest fires, and the like. Weather events can make routes impassable, breaking the supply chain network into isolated islands. However, the operator of a supply chain may not know the precise location of an impassible road. For example, the operator may know that a snow storm impacted a particular city or region, but may not know which particular roads are impassible. The operator may also know roads that were impacted by snow storms in the past. Based on this limited data, and using the algorithms disclosed herein, the operator can predict particular roads that will be impassible and adjust shipping routes accordingly or send snow removal equipment to those roads.

Events in a supply chain network can also include vehicle malfunctions. For example, trucks may break down or run out of fuel. Using limited previous data, e.g., vehicle maintenance data and data about which vehicles have malfunctioned in the past, and using the algorithms described herein, the operators of a supply chain network can predict what vehicles will malfunction and perform preventative maintenance on such vehicles. Similarly, a supply chain operator can predict equipment malfunctions at manufacturing plants.

Events in supply chain networks can also include traffic incidents. In some cases, incidents may make entire roads impassable. In other cases, accidents may affect only a particular vehicle. Examples of traffic incidents include vehicular accidents, construction, and large public events. Traffic incidents can cause shipping times to increase and consequently delay the transport of goods from a source to a destination.

Events in supply chain networks can also include worker shortages or strikes. Lack of workers may lead to increased shipping times.

Events in a supply chain network can be localized to a particular branch, e.g., road, shipping lane, railway, or flight path, a particular vehicle, a particular plant or distribution center, or to a particular supplier.

Events in a supply chain network, much like events in an electric distribution network, can cause portions of the supply chain network to become isolated from one another. Such isolated portions are referred to in this specification as "islands." As routes are restored, islands recombine. The ability to accurately predict likely failures in supply chain networks and localize failures at the node/route level can help to enhance reliability and timeliness of supply chain networks.

Figure 3:
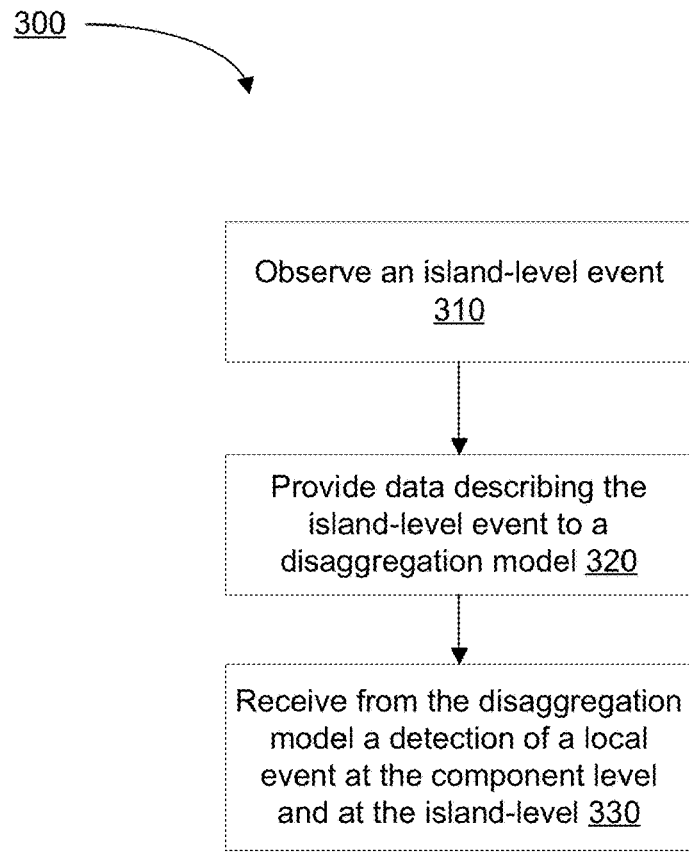
FIG. 3 is a flow chart of an example process for detecting and localizing events that occur in a distributed system using a disaggregation model.

FIG. 3 is a flow chart of an example process 300 for detecting and localizing events that occur in a network using a disaggregation model. The process 300 can be performed by one or more appropriately programmed computers that are configured to collect data, i.e., event data, about the network. For example, the process 300 can be performed by the event assignment server 120 depicted in FIG. 1. For convenience, the process 300 will be described as being performed by a single server. The process 300 can be adapted or modified for use in detecting and localizing events in any of the network types discussed above, including electrical distribution networks, telecommunications networks, computer networks, supply chain distribution networks, social networks, oil and gas production networks and the like.

The server observes an island-level event in the network (310). The network can be an electrical distribution network, a telecommunications network, a computing network, a supply chain network, a social network, an oil and gas production networks, or any other type of network.

An island-level event is an event that occurs in the network that is directly traceable to an island, but not to a component within the island. Islands are isolated partitions of the network. Islands can form when connections in the network break, e.g., when a distribution line in an electrical distribution network is downed, a component in a telecommunications network or computing network fails, or a route in a supply chain network becomes impassable. Similarly, two or more islands can merge when connections in the network are restored, e.g., when an electric utility repairs the downed distribution line in the electrical distribution network, when a failed component in a telecommunications network or computing network is fixed, or when an impassable route is cleared. As such, the islands that make up a network are capable of dynamically changing by splitting or merging with one another.

The dynamic changing of islands can involve multiple instances of splitting, merging, or re-merging of the islands. In general, the splitting of an island involves splitting two or more nodes or branches in that island, while merging two or more islands involves merging nodes or branches from each of those two or more islands. Put another way, the dynamic changing of islands can involve the splitting and/or merging of subsets of the individual components of an island. The subsets of individual components can be the same size, or the subsets of individual components can be variable sizes.

Each island can include one or more individual components. In general, the individual components in an island can be represented as nodes and one or more branches to or from those nodes. More specifically, an island in an electrical distribution network, for example, can include one or more of the following: power plants, transmission substations, high-voltage transmission lines, switches, circuit breakers, power substations, feeder lines or distribution lines, local transformers, and consumers. An island in a computing network can include a subset of servers, processors, interconnect, wireless routers, and wireless receivers in the distributed computing network. And an island in a system of automated equipment in a manufacturing plant can include a subset of such automated equipment. In some embodiments, islands are smaller partitions, e.g., partitions that include only subcomponents of the components listed above. For example, an island in an electrical distribution network may include only a subset of generators in a power plant, or a subset of transformers in a transmission substation. Any level of abstraction is possible.

In general, an event is a change in the operating state to one or more individual components in the network. For example, an event can be a failure, deletion, upgrade, alteration, or other similar change to a component. Examples of failures include severed branches, hardware failures, disruptions to data transfer paths, and other similar events that inhibit performance of the network. Deletions can involve the intentional removal, either temporarily or permanently, of components from the network, e.g., the temporary removal of a component for maintenance. Upgrades can be the addition of new components to the network, or the transient fluctuations in output from a component that naturally occur with variable operation. And alterations can involve substituting one or more components for one or more other components. In some embodiments, an event may create a bottleneck when flow between two components or nodes becomes constrained by a lack of connections.

One example of an event in an electrical distribution network is the opening or closing of a breaker switch within the electrical distribution network, where the breaker switch is associated with one or more of the nodes and/or branches of the electrical distribution network. Other examples of events in an electrical distribution network include broken generators, downed transmission and distribution lines, transformer failures, circuit-breaker overloads, and the like. Examples of events in a distributed computing system include hard drive failures, memory overload, race-conditions, and the like.

Events can cause other events, or even a cascading series of events. For example, a downed transmission line in an electrical distribution network can cause a circuit-breaker in another part of an electrical distribution network to overload. In some instances, an event may cause an entire island or the entire distribution network to fail.

The server can "observe" an event by collecting data that defines the event. Generally, the server cannot immediately identify a particular component in the network that caused or was the source of the event. This is because the server does not receive data from every node and branch in the network. For example, it would be impractical and expensive to outfit an entire electrical distribution network, which can include thousands of pieces of electrical equipment, hundreds of miles of transmission and distribution lines, and thousands of consumers, with the necessary sensors. Similarly, it would be impractical to outfit an entire supply chain network, which can cover thousands or millions of square miles of land, ocean, and air space spanning multiple countries, with sensors. However, the server can determine the general region in the network in which the event occurred based on data collected at a subset of nodes in the network. For example, the server can receive transmission and distribution line data from a subset of transmission and distribution lines. The data can include line temperatures and vibrations, instantaneous and average current and voltage measurements, and the like. Similarly, a subset of transformers, switches, circuit breakers, and electricity meters in the electrical distribution network can be outfitted with sensors that transmit data to the servers. The sensors can communicate with the server over a wired or wireless network.

By comparing data from different nodes across a network, the server can generally ascribe or assign the event to a particular island. The server can also use the data to map the network, particularly when the server does not have a pre-existing map of the network, or when the event changes the configuration of the network. Mapping the network can involve identifying isolated partitions, i.e., islands, of the network and their boundaries. Islands may be identifiable and distinguishable from one another based on one more or characteristics or properties of data that the server receives. For example, in the context of an electrical distribution network, islands may be identifiable and distinguishable from one another based on unexpected voltage levels in particular parts of the network.

The server provides data describing the island-level event to a disaggregation model (220). In general, a disaggregation model is a model that divides a system into a number of parts. In the context of this disclosure, those parts are the individual components that make up an island.

The disaggregation model is configured to, i.e., trained to, use the data to detect, isolate, and localize events at the individual component level. That is, the disaggregation model is configured to determine the individual component in the island that is responsible for, or that is the source of, the event. For example, a particular distribution line in an electrical distribution network may be the source of an event if that transmission line fails, e.g., buckles under the weight of heavy snow during a snow storm. Using island-level data describing the event, the disaggregation model is configured to identify the distribution line as the source of the event. As another example, server memory in a distributed computing network may be the source of an event if the memory exceeds capacity and disrupts data paths in the distributed computing network. Using island-level data describing the event, e.g., data that identifies the data paths disrupted in the distributed computing system, the disaggregation model is configured to identify the memory as the source of the event. The training of the disaggregation will be described in more detail in reference to FIG. 4.

The disaggregation model is configured to detect the one or more local events at the individual component level as the one or more of the islands are dynamically changing. Assigning or ascribing events to individual components is important for exactly this reason—because islands can split, merge, and remerge, it can be difficult to track which events belong to which islands.

In some embodiments, the disaggregation model is a machine learning latent variable model. Latent variables are variables that are not directly observed but are instead inferred from other variables that are observed. A classic example of a latent variable is general intelligence. General intelligence cannot be directly observed and measured, but it can be informed by other observed variables like standardized tests scores, high school or college grade point averages, subjective assessments, or combinations thereof. Another example of a latent variable is general health. Again, although general health cannot be directly measured, it can be informed by a number of other observed variables, including body mass index, resting heart rate, blood pressure, cholesterol levels and the like.

In the context of the networks described herein, the component that is responsible for, or the source of, a particular event is generally unobservable and therefore a latent variable that can be modeled. Although it is theoretically possible to observe the individual components that cause events, it is not practical to do for previously described reasons. However, (i) both the component that is responsible for a particular event and (ii) the probability that a particular component is the source of a given event can be inferred from other observable data organized into a latent variable model.

A machine learning latent variable model is a statistical model that (i) models latent variables like the ones described above and (ii) is refined over time through training, generally in an unsupervised learning environment. In the context of the networks described in this disclosure, a machine learning latent variable model can be implemented at the component level. That is, the machine learning latent variable model can include latent variables that each correspond to the probability of a local event occurring at each of the individual components.

For convenience, machine learning latent variable models will be referred to simply as latent variable models. The training of latent variable models will be described in more detail in reference to FIG. 4.

Latent variable models generally operate under the assumption that the observable variables are solely the result of their position on the latent variable and that the observable variables have nothing in common after controlling for the latent variable. This is known as local independence. A latent variable model of an electrical distribution network, for example, may operate under the assumption that voltage disparities are solely the consequence of the particular island on which the component that caused the event is located.

One example of a latent variable model is a mixture model. A mixture model is a probabilistic model for representing the presence of subpopulations within a larger population. That is, mixture models can be used to make statistical inferences about the properties of subpopulations given only observations about the entire population, without subpopulation identity information. The model does not require that observed data identify the sub-population to which an individual observation belongs. In the context of the networks described herein, observed island-level events can be the large population of a mixture model, and the individual components responsible for the events can be the present but unobserved subpopulations.

In a classic example, mixture models are used to model home prices. In general, different types of houses in different neighborhoods have vastly different prices, but the price of a particular type of house in a particular neighborhood, for example, tends to cluster. One possible model of such prices is a model that assumes that: (i) the prices are accurately described by a mixture model with k different components, (ii) each component has a normal distribution, and (iii) each component specifies a particular combination of house type/ neighborhood. Fitting this model to observed prices, e.g., by using the expectation-maximization algorithm, would tend to cluster the prices according to house type/neighborhood and reveal the spread of prices in each house type/neighborhood.

This same approach is applicable to the networks described herein. One possible model of events in a network is a model that assumes that: (i) island-level events can be traced to one of k different components in the island, (ii) each component has a normal distribution, and (iii) each component of the model specifies a physical component in the island. Fitting this model to observed island-level events, e.g., by using the expectation maximization algorithm, would tend to cluster the observed events by the component responsible for the events and reveal the likelihood of a given event originating at a particular component.

Another example of a latent variable model is a Bayesian model. In general, a Bayesian model is a probabilistic graphical model that represents a set of variables or features and their conditional dependencies. A Bayesian model can utilize a directed acyclic graph (DAG) to represent the variables or features. Each variable or feature can be represented by a node in the Bayesian model. In one example, there can be a connection, link, or edge between a first node and a second node if one node is influenced by or dependent upon the other. If the first node is influenced by or dependent upon the second node, then the connection can be directed from the second node to the first node. If the second node is influenced by or dependent upon the first node, then the connection can be directed from the first node to the second node.

A Bayesian model can represent probabilistic relationships among island-level events. In one example, when limited data about island-level events is available, a Bayesian model can be used to determine, infer, or predict the individual component that is responsible for the island-level event.

The inference of the individual component that is responsible for the event can be based on at least some data that is provided to the Bayesian model. For example, some island-level event data can be provided to the Bayesian. In some implementations, inferring the individual component in an island that is responsible for an event includes applying a maximum a posteriori estimation process to the Bayesian model to acquire the plurality of energy consumption values for the plurality of energy consumption sources associated with the user. In general, with respect to the Bayesian network model, the maximum a posteriori estimation process can correspond to a mode of a posterior distribution. The maximum a posteriori estimation process can be utilized to acquire a point estimate of an unobserved quantity, e.g., the probability of particular components being responsible for an event, on the basis of empirical data, e.g., island-level data from previous events. In one example, one or more of the probabilities that individual components cause a given event in an island are unknown. The maximum a posteriori estimation process can determine, infer, or estimate the most likely values for the one or more unknown probabilities based on available information, such as the limited data island-event data. As such, the disaggregated probabilities can be determined, inferred, or estimated using the maximum a posteriori estimation process. It is appreciated that many variations are possible. Moreover, in some embodiments, the inferring of the plurality of individual component probabilities can be performed without installing additional sensors in the distribution network.

Referring again to FIG. 3, the server receives from the disaggregation model, which can be any of the models described above, a detection of a local event at the component-level and at the island-level (330). The detection can be used to perform predictive maintenance on the component. In some implementations, the process 300 is used to predict component-level events before they occur and perform maintenance on the corresponding components.

Figure 4:
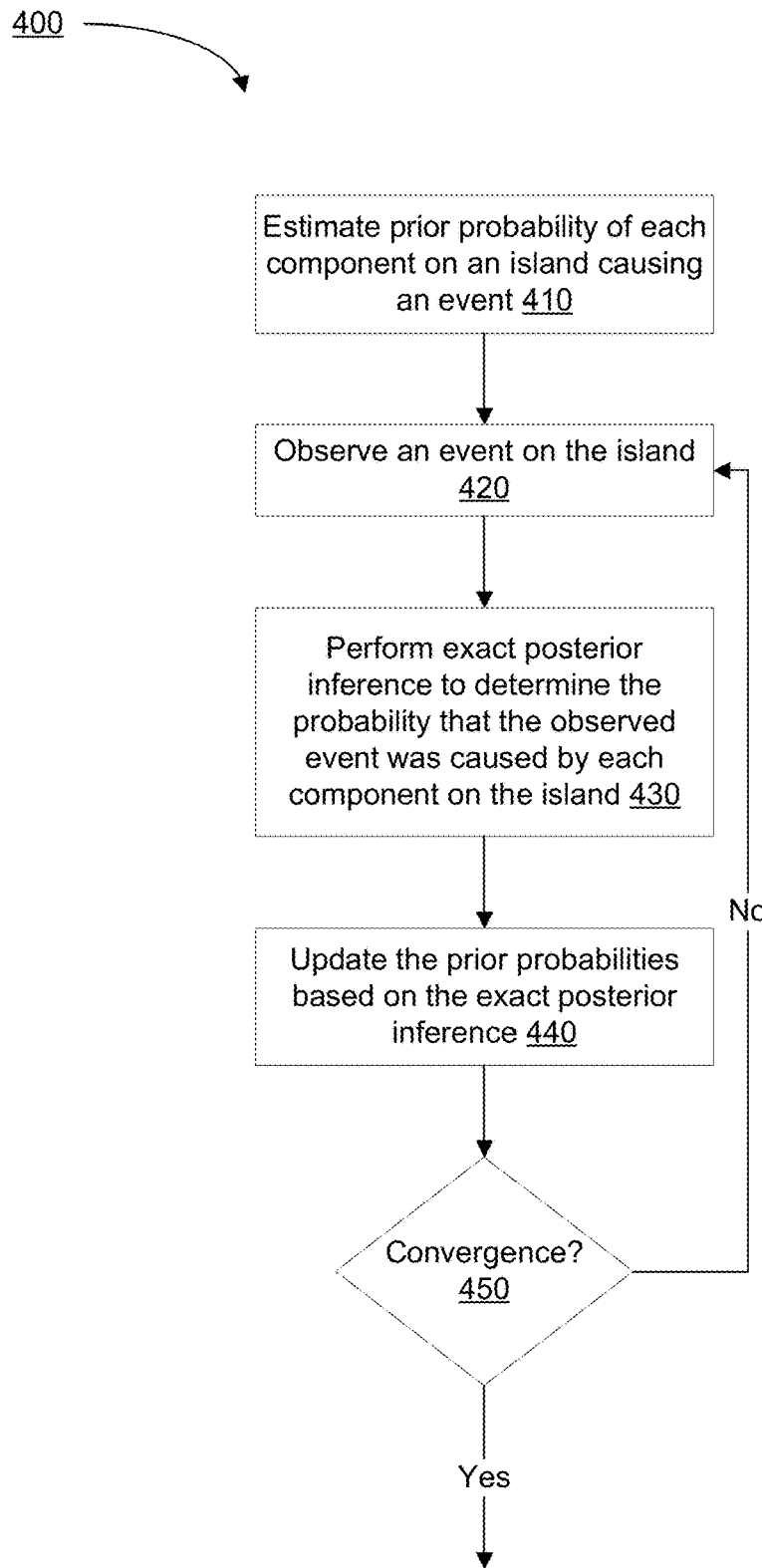
FIG. 4 is a flow chart of an example process for training a latent variable model.

FIG. 4 is a flow chart of an example process 400 for training a latent variable model, e.g., one or more of the latent variable models described in reference to FIG. 3. Specifically, the process 400 corresponds to the expectation maximization algorithm. The expectation maximization algorithm is an unsupervised learning algorithm in that training examples need not be labeled. Indeed, because latent variable models model unobserved variables, it is often impractical or impossible to provide labels for training examples. The process 400 can be performed by the training module 127 depicted in FIG. 1.

Preliminarily, the expectation maximization algorithm is an iterative method to find the maximum likelihoods or maximum a posteriori estimates of parameters in statistical models, where the models depend on unobserved latent variables. In the context of the networks described herein, the unobserved latent variables are the individual components that cause island-level events, and the parameters are the probabilities that the individual components are the source of given island-level events.

A maximum a posteriori probability estimate is an estimate of an unknown quantity that equals the mode of the posterior distribution of that unknown quantity. The maximum a posteriori probability can be used to obtain a point estimate of an unobserved quantity on the basis of empirical data, e.g., island-level data. It is closely related to the method of maximum likelihood estimation, but employs an augmented optimization objective which incorporates a prior distribution (that quantifies the additional information available through prior knowledge of a related event) over the quantity one wants to estimate. Maximum a posteriori estimation can therefore be seen as a regularization of maximum likelihood estimation.

The expectation maximization iteration alternates between performing an expectation step, which creates a function for the expectation of the log-likelihood evaluated using the current estimate for the parameters, e.g., the component probabilities, and a maximization step, which computes the parameters maximizing the expected log-likelihood found on the expectation step. These parameter-estimates are then used to determine the distribution of the latent variables in the next expectation step.

In others words, one uses prior knowledge of related events to model probability distributions that future events will occur. In the context of the networks described herein, this means that the probability that each component in an island is responsible for, or is the source of, an island-level event is precomputed or pre-estimated. The precomputed probability is actually a probability distribution. When an event is observed, the model infers a probability that a particular component caused the event, and the precomputed probability distributions are updated based on the inference and the new event.

The training module estimates a prior probability of each component on an island causing an event (410). Generally, the prior probability is a probability distribution over observed variables. The prior probabilities can be initially known, actual or estimated probabilities based on previous event data.

The training module, which is implemented on the server, observes an event on an island (420). As previously mentioned, observing the event involves collecting island-level data defining the event. However, that data does not include the component to which the event should be assigned, which is the latent variable being modeled.

Using the island-level event data that is available and the prior probability distributions, the training module performs exact posterior analysis to determine the probability that the observed event was caused by each component on the island (430). A posterior inference is an estimate of an unknown quantity that equals the mode of the posterior distribution, which is the conditional probability that is assigned to the latent variable, e.g., the individual component in the island that is responsible for an island-level event, after the relevant evidence or background is taken into account.

The training module updates the prior probabilities based on the new event data and the inference (440).

Steps 420 to 440 are repeated until convergence, i.e., until the latent variable distributions change less than some threshold amount when new events are observed (450).

Figure 5A:
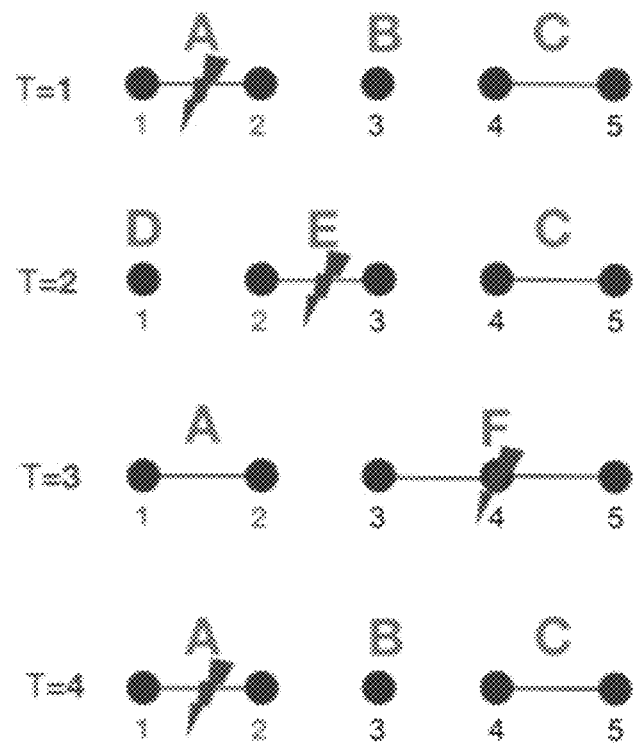
FIG. 5a depicts splitting, merging, and remerging of nodes in a one-dimensional distributed system.

FIG. 5a depicts a one-dimensional example of island splitting and merging in a network. At time T=1, the network has three islands A, B, and C. Island A is made up of nodes 1 and 2, island B of node 3, and island C of nodes 4 and 5.

At time T=2, due to an event between nodes 1 and 2 at time T=1, node 2 splits from node 1 and mergers with node 3. The result is a new island D made only of node 1 and a new island E made of nodes 2 and 3. Node C remained the same.

At time T=3, due to an event between nodes 2 and 3 at time T=2, node 2 remerges with node 1 and node 3 merges with nodes 4 and 5. The result is that island A is re-formed, and nodes 3, 4, and 5, make up island F, which is new.

At time T=4, due to an event at node 4 at time T=3, node 3 splits from node 4, resulting in all of the original islands A, B, and C reforming.

Figure 5B:

FIG. 5b depicts hypothetical probabilities of an event occurring at each node at each time.

The present disclosure provides computer systems that are programmed to implement methods of the disclosure.

Figure 6:
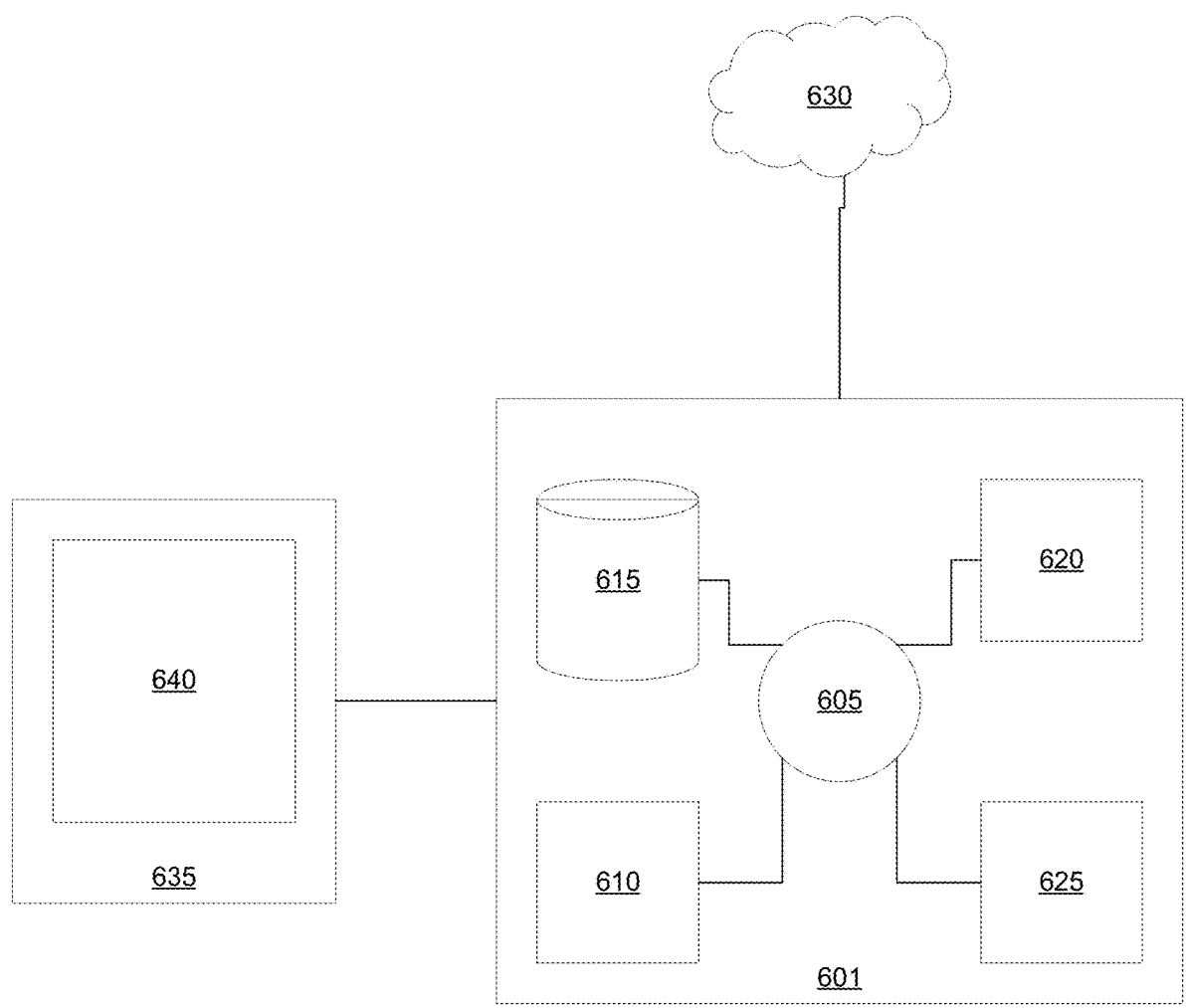
FIG. 6 is a diagram of a computer system that is programmed or otherwise configured to implement methods provided herein.

FIG. 6 shows a computer system 601 that is programmed or otherwise configured to implement methods provided herein.

The computer system 601 can regulate various aspects of the present disclosure, such as, for example, obtaining an inventory dataset comprising a plurality of inventory variables, applying a trained algorithm to the inventory dataset to generate a prediction of the variables having future uncertainty, and applying an optimization algorithm to the inventory dataset to optimize the plurality of inventory variables. The computer system 601 can be an electronic device of a user or a computer system that is remotely located with respect to the electronic device. The electronic device can be a mobile electronic device.

The computer system 601 includes a central processing unit (CPU, also "processor" and "computer processor" herein) 605, which can be a single core or multi core processor, or a plurality of processors for parallel processing. The computer system 601 also includes memory or memory location 610 (e.g., random-access memory, read-only memory, flash memory), electronic storage unit 615 (e.g., hard disk), communication interface 620 (e.g., network adapter) for communicating with one or more other systems, and peripheral devices 625, such as cache, other memory, data storage and/or electronic display adapters. The memory 610, storage unit 615, interface 620 and peripheral devices 625 are in communication with the CPU 605 through a communication bus (solid lines), such as a motherboard. The storage unit 615 can be a data storage unit (or data repository) for storing data. The computer system 601 can be operatively coupled to a computer network ("network") 630 with the aid of the communication interface 620. The network 630 can be the Internet, an internet and/or extranet, or an intranet and/or extranet that is in communication with the Internet.

The network 630 in some cases is a telecommunication and/or data network. The network 630 can include one or more computer servers, which can enable distributed computing, such as cloud computing. For example, one or more computer servers may enable cloud computing over the network 630 ("the cloud") to perform various aspects of analysis, calculation, and generation of the present disclosure, such as, for example, obtaining an inventory dataset comprising a plurality of inventory variables, applying a trained algorithm to the inventory dataset to generate a prediction of the variables having future uncertainty, and applying an optimization algorithm to the inventory dataset to optimize the plurality of inventory variables. Such cloud computing may be provided by cloud computing platforms such as, for example, Amazon Web Services (AWS), Microsoft Azure, Google Cloud Platform, and IBM cloud. The network 630, in some cases with the aid of the computer system 601, can implement a peer-to-peer network, which may enable devices coupled to the computer system 601 to behave as a client or a server.

The CPU 605 can execute a sequence of machine-readable instructions, which can be embodied in a program or software. The instructions may be stored in a memory location, such as the memory 610. The instructions can be directed to the CPU 605, which can subsequently program or otherwise configure the CPU 605 to implement methods of the present disclosure. Examples of operations performed by the CPU 605 can include fetch, decode, execute, and writeback.

The CPU 605 can be part of a circuit, such as an integrated circuit. One or more other components of the system 601 can be included in the circuit. In some cases, the circuit is an application specific integrated circuit (ASIC).

The storage unit 615 can store files, such as drivers, libraries and saved programs. The storage unit 615 can store user data, e.g., user preferences and user programs. The computer system 601 in some cases can include one or more additional data storage units that are external to the computer system 601, such as located on a remote server that is in communication with the computer system 601 through an intranet or the Internet.

The computer system 601 can communicate with one or more remote computer systems through the network 630. For instance, the computer system 601 can communicate with a remote computer system of a user. Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system 601 via the network 630.

Methods as described herein can be implemented by way of machine (e.g., computer processor) executable code stored on an electronic storage location of the computer system 601, such as, for example, on the memory 610 or electronic storage unit 615. The machine executable or machine readable code can be provided in the form of software. During use, the code can be executed by the processor 605. In some cases, the code can be retrieved from the storage unit 615 and stored on the memory 610 for ready access by the processor 605. In some situations, the electronic storage unit 615 can be precluded, and machine-executable instructions are stored on memory 610.

The code can be pre-compiled and configured for use with a machine having a processor adapted to execute the code, or can be compiled during runtime. The code can be supplied in a programming language that can be selected to enable the code to execute in a pre-compiled or as-compiled fashion.

Aspects of the systems and methods provided herein, such as the computer system 601, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 601 can include or be in communication with an electronic display 635 that comprises a user interface (UI) 640. Examples of user interfaces (UIs) include, without limitation, a graphical user interface (GUI) and web-based user interface. For example, the computer system can include a web-based dashboard (e.g., a GUI) configured to display, for example, a BOM to a user.

Methods and systems of the present disclosure can be implemented by way of one or more algorithms. An algorithm can be implemented by way of software upon execution by the central processing unit 605. The algorithm can, for example, obtain an inventory dataset comprising a plurality of inventory variables, apply a trained algorithm to the inventory dataset to generate a prediction of the variables having future uncertainty, and apply an optimization algorithm to the inventory dataset to optimize the plurality of inventory variables.

Although the description has been described with respect to particular embodiments thereof, these particular embodiments are merely illustrative, and not restrictive. Concepts illustrated in the examples may be applied to other examples and implementations.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

The invention claimed is:

1. A computer-implemented method of training a machine learning model, comprising:
receiving an island-level event data describing an island-level event occurring at an island that is capable of dynamically changing by splitting or merging with another island, wherein:
the island is a part of a network comprising a plurality of islands including the another island and comprises one or more individual components; and
the island-level event data fails to immediately identify a source individual component of the island-level event from the one or more individual components;
estimating a prior probability of each of the one or more individual components causing the island-level event;
performing a posterior inference, using the machine learning model and based on the island-level event data and the prior probability of each of the one or more individual components, to determine a probability estimate of each of the one or more individual components causing the island-level event;

updating the prior probability of each of the one or more individual components based on a result of the performance of the posterior inference; and executing the receiving the island-level event data, the performing the posterior inference, and the updating the prior probability repeatedly until a difference between the updated and estimated prior probability of each of the one or more individual components is less than a threshold difference, wherein, after the executing, the machine learning model is trained to receive the island-level event data describing the island-level event occurring at the island, and identify the source individual component as a cause of the island-level event based on the received island-level event data as the island is dynamically changing.

2. The method of claim 1, wherein the posterior inference is an exact posterior inference.

3. The method of claim 1, wherein the prior probability comprises an initially known, actual or estimated probability of each of the one or more individual components causing the island-level event based on previous event data.

4. The method of claim 1, wherein the prior probability of each of the one or more individual components is updated iteratively using an Expectation Maximization (EM) algorithm.

5. The method of claim 1, wherein the network comprises an electrical distribution network including a plurality of nodes and one or more branches, and the one or more individual components of the island comprise at least a portion of the plurality of nodes and the one or more branches.

6. The method of claim 1, wherein the island-level event data describing the island-level event occurring at the island is collected from a subset of the one or more individual components of the island.

7. The method of claim 1, wherein the machine learning model is a machine learning latent variable model including a Bayesian model or a mixture model.

8. A system for training a machine learning model, comprising:
 a processor; and
 a memory device coupled to the processor and including instructions that, when executed by the processor, configure the processor to perform operations comprising:
  receiving an island-level event data describing an island-level event occurring at an island that is capable of dynamically changing by splitting or merging with another island, wherein:
   the island is a part of a network comprising a plurality of islands including the another island and comprises one or more individual components; and
   the island-level event data fails to immediately identify a source individual component of the island-level event from the one or more individual components;
  estimating a prior probability of each of the one or more individual components causing the island-level event;
  performing a posterior inference, using the machine learning model and based on the island-level event data and the prior probability of each of the one or more individual components, to determine a probability estimate of each of the one or more individual components causing the island-level event;
  updating the prior probability of each of the one or more individual components based on a result of the performance of the posterior inference; and
  executing the receiving the island-level event data, the performing the posterior inference, and the updating the prior probability repeatedly until a difference between the updated and estimated prior probability of each of the one or more individual components is less than a threshold difference, wherein:
   after the executing, the machine learning model is trained to receive the island-level event data describing the island-level event occurring at the island, and identify the source individual component as a cause of the island-level event based on the received island-level event data as the island is dynamically changing.

9. The system of claim 8, wherein the posterior inference is an exact posterior inference.

10. The system of claim 8, wherein the prior probability comprises an initially known, actual or estimated probability of each of the one or more individual components causing the island-level event based on previous event data.

11. The system of claim 8, wherein the prior probability of each of the one or more individual components is updated iteratively using an Expectation Maximization (EM) algorithm.

12. The system of claim 8, wherein the network comprises an electrical distribution network including a plurality of nodes and one or more branches, and the one or more individual components of the island comprise at least a portion of the plurality of nodes and the one or more branches.

13. The system of claim 8, wherein the island-level event data describing the island-level event occurring at the island is collected from a subset of the one or more individual components of the island.

14. The system of claim 8, wherein the machine learning model is a machine learning latent variable model including a Bayesian model or a mixture model.

15. A non-transitory event assignment computer-readable medium (CRM) in which a program is stored for causing a computer to perform operations comprising:
 receiving an island-level event data describing an island-level event occurring at an island that is capable of dynamically changing by splitting or merging with another island, wherein:
  the island is a part of a network comprising a plurality of islands including the another island and comprises one or more individual components; and
  the island-level event data fails to immediately identify a source individual component of the island-level event from the one or more individual components;
 estimating a prior probability of each of the one or more individual components causing the island-level event;
 performing a posterior inference, using a machine learning model and based on the island-level event data and the prior probability of each of the one or more individual components, to determine a probability estimate of each of the one or more individual components causing the island-level event;
 updating the prior probability of each of the one or more individual components based on a result of the performance of the posterior inference; and
 executing the receiving the island-level event data, the performing the posterior inference, and the updating the prior probability repeatedly until a difference between the updated and estimated prior probability of each of the one or more individual components is less than a threshold difference, wherein:
  after the executing, the machine learning model is trained to receive the island-level event data describing the island-level event occurring at the island, and identify the source individual component as a cause of the island-level event based on the received island-level event data as the island is dynamically changing.

16. The non-transitory event assignment CRM of claim 15, wherein the posterior inference is an exact posterior inference.

17. The non-transitory event assignment CRM of claim 15, wherein the prior probability comprises an initially known, actual or estimated probability of each of the one or more individual components causing the island-level event based on previous event data.

18. The non-transitory event assignment CRM of claim 15, wherein the prior probability of each of the one or more individual components is updated iteratively using an Expectation Maximization (EM) algorithm.

19. The non-transitory event assignment CRM of claim 15, wherein the network comprises an electrical distribution network including a plurality of nodes and one or more branches, and the one or more individual components of the island comprise at least a portion of the plurality of nodes and the one or more branches.

20. The non-transitory event assignment CRM of claim 15, wherein the island-level event data describing the island-level event occurring at the island is collected from a subset of the one or more individual components of the island.

21. The non-transitory event assignment CRM of claim 15, wherein the machine learning model is a machine learning latent variable model including a Bayesian model or a mixture model.

* * * * *